(12) United States Patent  
Yoo (10) Patent No.: US 10,475,813 B2
(45) Date of Patent: Nov. 12, 2019

(54) FERROELECTRIC MEMORY DEVICE AND METHOD OF MANUFACTURING THE SAME

(71) Applicant: SK hynix Inc., Icheon (KR)

(72) Inventor: Hyangkeun Yoo, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 15/820,376

(22) Filed: Nov. 21, 2017

(65) Prior Publication Data

US 2018/0240804 A1 Aug. 23, 2018

(30) Foreign Application Priority Data

Feb. 23, 2017 (KR) .................. 10-2017-0024300

(51) Int. Cl.
*H01L 21/02* (2006.01)
*H01L 27/1159* (2017.01)
*H01L 29/51* (2006.01)
*H01L 29/423* (2006.01)
*H01L 29/49* (2006.01)
(Continued)

(52) U.S. Cl.
CPC ........ *H01L 27/1159* (2013.01); *H01L 21/022* (2013.01); *H01L 21/02181* (2013.01); *H01L 21/02189* (2013.01); *H01L 21/02356* (2013.01); *H01L 21/28079* (2013.01); *H01L 21/28088* (2013.01); *H01L 21/28167* (2013.01); *H01L 21/28291* (2013.01); *H01L 29/42364* (2013.01); *H01L 29/495* (2013.01); *H01L 29/4966* (2013.01); *H01L 29/513* (2013.01); *H01L 29/516* (2013.01); *H01L 29/517* (2013.01); *H01L 29/78391* (2014.09); *H01L 29/6684* (2013.01)

(58) Field of Classification Search
CPC ........... H01L 27/1159; H01L 21/02356; H01L 21/02189; H01L 21/28079; H01L 29/517; H01L 29/6684; H01L 29/42364; H01L 29/516; H01L 29/78391; H01L 21/28088; H01L 21/022; H01L 29/495; H01L 21/28167
See application file for complete search history.

(56) References Cited

U.S. PATENT DOCUMENTS 5,789,071 A * 8/1998 Sproul ................ C23C 14/0021
428/216
2003/0152813 A1* 8/2003 Paz de Araujo .... C23C 16/4412
428/701
(Continued)

FOREIGN PATENT DOCUMENTS

KR 1020150005709 A 1/2015

OTHER PUBLICATIONS

Okuyama et al., Ferroelectric Thin Films, Springer, pp. 1-4 (Retrieved through Google Books) (Year: 2005).*

*Primary Examiner* — Allen L Parker
*Assistant Examiner* — Wasiul Haider (57) ABSTRACT

In an embodiment, a ferroelectric memory device includes a substrate having a source region and a drain region. The ferroelectric memory device includes a ferroelectric superlattice structure disposed on the substrate and having at least two kinds of different dielectric layers alternately stacked. Further, the ferroelectric memory device includes a gate electrode layer disposed on the superlattice structure.

17 Claims, 10 Drawing Sheets

(51) Int. Cl.
*H01L 29/78* (2006.01)
*H01L 21/28* (2006.01)
*H01L 29/66* (2006.01)

(56) References Cited

U.S. PATENT DOCUMENTS

| | | | |
|---|---|---|---|
| 2004/0036111 A1* | 2/2004 | Nishikawa | H01L 21/28273 257/316 |
| 2007/0049051 A1* | 3/2007 | Ahn | C23C 16/40 438/778 |
| 2009/0087623 A1* | 4/2009 | Brazier | C23C 16/405 428/188 |
| 2013/0244016 A1 | 9/2013 | Osada et al. | |
| 2017/0294219 A1* | 10/2017 | Nicholes | G11C 11/225 |
| 2018/0218911 A1* | 8/2018 | Hung | H01L 21/28088 |

* cited by examiner

FERROELECTRIC MEMORY DEVICE AND
METHOD OF MANUFACTURING THE SAME

CROSS-REFERENCE TO RELATED
APPLICATION

The present application claims priority under 35 U.S.C. 119(a) to Korean Patent Application No. 10-2017-0024300, filed on Feb. 23, 2017, which is herein incorporated by reference in its entirety.

BACKGROUND

1. Technical Field

Embodiments of the present disclosure relate to a ferroelectric memory device and a method of manufacturing the same.

2. Related Art

In general, a ferroelectric material is a material having spontaneous electrical polarization in the absence of an applied external electric field. More specifically, a ferroelectric material can maintain one of two stable remanent polarization states. Thus, a ferroelectric material may be utilized to store digital information in a nonvolatile manner. For example, binary information "0" or "1" may be stored in remanent polarization states.

Remanent polarization in a ferroelectric material can be reversibly switched by applying an external electric field. The application of ferroelectric materials in nonvolatile memory devices has been actively studied. As an example, perovskite materials, which can manifest ferroelectric properties or characteristics, such as lead zirconate titanate (PZT) or strontium bismuth tantalite (SBT) have been studied for applications in nonvolatile memory devices.

SUMMARY

In an aspect of the present disclosure, a ferroelectric memory device having a layer of ferroelectric material is disclosed. The fabrication process of the ferroelectric memory device is compatible with conventional semiconductor integrated circuit fabrication processes. The ferroelectric memory device according to an aspect of the present disclosure may include a substrate having a source region and a drain region. The ferroelectric memory device may include a ferroelectric superlattice structure disposed on the substrate. The ferroelectric superlattice structure may have at least two kinds of different dielectric layers alternately stacked or layered. In addition, the ferroelectric memory device may include a gate electrode layer disposed on the ferroelectric superlattice structure.

In another aspect of the present disclosure, a method of manufacturing a ferroelectric memory device is disclosed. In the method, a substrate may be provided. At least two kinds of different dielectric layers are alternately stacked or layered on the substrate to form a ferroelectric superlattice structure. A gate electrode layer is formed on the ferroelectric superlattice structure.

DETAILED DESCRIPTION

Various embodiments will now be described hereinafter with reference to the accompanying drawings. In the drawings, the dimensions of layers and regions may be exaggerated for clarity of illustration. The drawings are described with respect to an observer's viewpoint. If a first element is referred to as located on a second element, it may be understood that the first element is directly located on the second element; that an additional element may be interposed between the first element and the second element; or that a portion of the first element is directly located on a portion of the second element. The same reference numerals may refer to the same elements throughout the specification.

In addition, expression of a singular form of a word includes the plural forms of the word unless clearly used otherwise in the context of the disclosure. The terms "comprise" or "have" are intended to specify the presence of a feature, a number, a step, an operation, an element, a component, a part, or combinations thereof, but neither term precludes the presence or possibility of the addition of one or more other features, numbers, steps, operations, elements, components, parts, or combinations thereof. Further, each step or process in a method or a manufacturing method need not be performed in any order set forth in the disclosure unless a specific sequence is explicitly described. In other words, each step or process in a method or manufacturing method disclosed herein may be performed sequentially in the stated order, may be performed out of sequence from the stated order, or may be performed substantially at the same time as one or more other steps or processes. The steps or processes may also be performed in a reverse order.

An embodiment of the present disclosure includes a ferroelectric memory device having a ferroelectric superlattice structure. Techniques for developing or inducing ferroelectric properties in paraelectric materials have been reported in recent research. As an example, it has been reported that, in a thin film fabricating process, when anisotropic stress is applied to a thin non-ferroelectric hafnium oxide film, a lattice structure is transformed from a tetragonal crystal system to an orthorhombic crystal system, forming a hafnium oxide layer having ferroelectric properties. By way of non-limiting examples, anisotropic stress may be produced through doping with dopants, surface energy effects, and thin film growth mechanisms in relation to a hafnium oxide layer. J. Müller, et al. (*Nano Lett.*, 2012, 12 (8), pp 4318-4323) has disclosed that in a solid solution of $Hf_xZr_yO_2$ (0<x, y<1) including hafnium oxide ($HfO_2$) and zirconium oxide ($ZrO_2$), when the content ratio of hafnium (Hf) and zirconium (Zr) constituting the hafnium oxide ($HfO_2$) and the zirconium oxide ($ZrO_2$) is controlled, the $Hf_xZr_yO_2$ solid solution can have a structure of four-crystal system that has ferroelectric properties.

In an embodiment, a superlattice structure is disclosed having two or more kinds of different dielectric layers that are alternately stacked or layered on a substrate. In a non-limiting example, within the superlattice structure, a first dielectric layer having a first composition may be disposed on a substrate, followed by a first dielectric layer having a second composition. A second dielectric layer having a first composition may be disposed on the first dielectric layer having a second composition, followed by a second dielectric layer having a second composition. Additional dielectric layers may be sequentially disposed on previously disposed dielectric layers consistent with this alternating pattern to form a superlattice structure. In another non-limiting example, one or more unit-stacks may be used in a superlattice structure. A unit-stack may comprise a dielectric layer with a first composition, followed by a dielectric layer with a second, different composition disposed on the dielectric layer with a first composition. Additional unit-stacks in a superlattice structure may be oriented such that, within the superlattice structure, dielectric layers with a first composition are disposed between dielectric layers with a second composition and dielectric layers with a second composition are disposed between dielectric layers with a first composition, or such that, within the superlattice structure, dielectric layers with a first composition are alternated with dielectric layers with a second composition.

According to an embodiment of the present disclosure, in a superlattice structure, lattice strain in portions of interface regions between dielectric layers with different compositions may be controlled by controlling the number of or the thickness of dielectric layers. Thus, the ferroelectric properties of the superlattice structure can be controlled through development of anisotropic stress in the interface regions.

Figure 1:
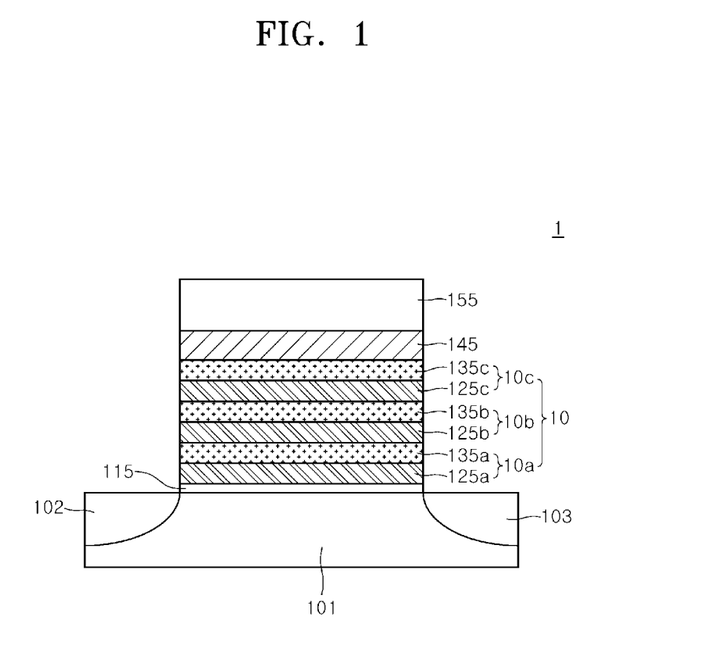
FIG. 1 is a schematic view illustrating a ferroelectric memory device according to an embodiment of the present disclosure.

FIG. 1 is a schematic view illustrating a ferroelectric memory device according to an embodiment of the present disclosure. Referring to FIG. 1, the ferroelectric memory device 1 may include a substrate 101 having a source region 102 and a drain region 103. In addition, ferroelectric memory device 1 may include a superlattice structure 10 and a gate electrode layer 155 that are disposed over substrate 101. The ferroelectric memory device 1 of this embodiment may be a nonvolatile memory device such as a transistor.

Substrate 101 may comprise a semiconductor material. By way of non-limiting examples, substrate 101 may comprise a silicon (Si) substrate, a gallium arsenide (GaAs) substrate, an indium phosphide (InP) substrate, a germanium (Ge) substrate, or a silicon germanium (SiGe) substrate. Substrate 101 may be doped with n-type or p-type dopants to have conductivity.

Source region 102 and drain region 103 may be doped with n-type or p-type dopants. In an embodiment, when substrate 101 is n-type doped, source region 102 and drain region 103 may be p-type doped. In another embodiment, when substrate 101 is p-type doped, source region 102 and drain region 103 may be n-type doped.

An interfacial insulation layer 115 may be disposed between substrate 101 and superlattice structure 10. Interfacial insulation layer 115 may form stable interfaces with each of the substrate 101 and superlattice structure 10 such that interfacial insulation layer 115 suppresses interfacial defects generated at an interface when substrate 101 directly contacts a dielectric layer 125 of superlattice structure 10. The interfacial defects may deteriorate an insulation property between the substrate 101 and superlattice structure 10. For example, interfacial insulation layer 115 may have a lattice constant that is between the lattice constant of substrate 101 and the lattice constant of superlattice structure 10. In addition, interfacial insulation layer 115 can suppress material diffusion between substrate 101 and superlattice structure 10. Interfacial insulation layer 115 may be comprised of silicon oxide, silicon nitride, or silicon oxynitride as non-limiting examples. Interfacial insulation layer 115 may have an amorphous state.

Superlattice structure 10 may include at least two kinds of different dielectric layers that are alternately stacked or layered. In an embodiment, each of the at least two kinds of different dielectric layers may have a ferroelectric characteristic before each layer is included in superlattice structure 10. In another embodiment, each of the at least two kinds of different dielectric layers may not have a ferroelectric characteristic before each layer is included in ferroelectric superlattice structure 10.

Referring to FIG. 1, in an embodiment, superlattice structure 10 may include dielectric layers 125a, 125b 125c, 135a, 135b and 135c. Dielectric layers 125a, 125b and 125c may comprise hafnium oxide, and dielectric layers 135a, 135b and 135c may comprise zirconium oxide.

In an embodiment, hafnium oxide layers 125a, 125b and 125c and zirconium oxide layers 135a, 135b and 135c may be un-doped. In another embodiment, hafnium oxide layers 125a, 125b and 125c and zirconium oxide layers 135a, 135b and 135c may each comprise, as dopants, carbon (C), silicon (Si), magnesium (Mg), aluminum (Al), yttrium (Y), nitrogen (N), germanium (Ge), tin (Sn), strontium (Sr), lead (Pb), calcium (Ca), barium (Ba), titanium (Ti), zirconium (Zr), gadolinium (Gd), or a combination of two or more thereof, by way of non-limiting examples.

In an embodiment, superlattice structure 10 may include a plurality of unit-stacks 10a, 10b and 10c. Unit-stack 10a may include one hafnium oxide layer 125a and one zirconium oxide layer 135a. Likewise, unit-stack 10b may include one hafnium oxide layer 125b and one zirconium oxide layer 135b, and unit-stack 10c may include one hafnium oxide layer 125c and one zirconium oxide layer 135c. In an embodiment, superlattice structure 10 may include three unit-stack structures 10a, 10b and 10c, with one unit-stack structure disposed on interfacial insulation layer 115 and the remaining unit-stack structures disposed such that the hafnium oxide layers 125a, 125b and 125c alternate with zirconium oxide layers 135a, 135b and 135c. However, in some other embodiments, the number of unit-stacks may not be limited to be three. In such embodiments, two or more unit-stacks may be included in the superlattice structure, with dielectric layers having a first composition disposed between, or alternatingly layered between, dielectric layers having a second composition.

In an embodiment, each of the hafnium oxide layers 125a, 125b and 125c and each of the zirconium oxide layers 135a, 135b and 135c, may be a monolayer having a thickness of about five angstroms (5 Å). In another embodiment, each of the hafnium oxide layers 125a, 125b and 125c and each of the zirconium oxide layers 135a, 135b and 135c, may include a plurality of monolayers, with each monolayer having a thickness of about 5 Å.

In an embodiment, superlattice structure 10 may have an entire thickness of about five to twenty nanometers (5 to 20 nm). Accordingly, the number of unit-stacks constituting superlattice structure 10 may be varied to achieve a thickness of about 5 to 20 nm, or to achieve a different thickness. Alternatively, the thicknesses of hafnium oxide layers 125a, 125b and 125c and zirconium oxide layers 135a, 135b and 135c may be individually varied to achieve a total thickness of superlattice structure 10 of about 5 to 20 nm, or to achieve a different thickness.

In an embodiment, hafnium oxide layers 125a, 125b and 125c and zirconium oxide layers 135a, 135b and 135c may each have the same thickness. In a further embodiment, hafnium oxide layers 125a, 125b and 125c and zirconium oxide layers 135a, 135b and 135c may each have the same number of monolayers.

Referring to FIG. 1, the uppermost layer of superlattice structure 10 may be zirconium oxide layer 135c, on which depolarization suppressing layer 145 is disposed. Also, the lowest layer of superlattice structure 10 disposed on substrate 101 and interfacial insulation layer 115 may be hafnium oxide layer 125a, which may interface with the interfacial insulation layer 115.

A depolarization suppressing layer 145 may be disposed between superlattice structure 10 and gate electrode layer 155. Generally, when a ferroelectric material and a conductor, which are different kinds of materials, directly form an interface, a depolarization phenomenon may occur in an interface region of the different materials. The depolarization phenomenon means that the ferroelectricity of the ferroelectric material is lowered or diminished at an interface region between the ferroelectric material and the conductor. The depolarization phenomenon may degrade fatigue characteristics of the ferroelectric material when switching operations for remanent polarization of the ferroelectric material is repeatedly performed. In this embodiment, depolarization suppressing layer 145 is disposed between superlattice structure 10 and gate electrode layer 155 to prevent the ferroelectric properties of the ferroelectric superlattice structure 10 from deteriorating.

Depolarization suppressing layer 145 may include an electrical insulator. In an embodiment, depolarization suppressing layer 145 may have a high-k dielectric constant such that polarization deterioration from repeated switching operations may be suppressed at an interface between superlattice structure 10 and depolarization suppressing layer 145. As an example, a depolarization suppressing layer 145 having a high-k dielectric constant may include a zirconium oxide layer. As another example, a depolarization suppressing layer 145 having a high-k dielectric constant may include an aluminum oxide layer.

Referring to FIG. 1, gate electrode layer 155 may be disposed on depolarization suppressing layer 145. Gate electrode layer 155 may include, without limitation, metal, conductive metal nitride, conductive metal oxide, or conductive metal carbide. For example, gate electrode layer 155 may include tungsten (W), titanium (Ti), copper (Cu), aluminum (Al), ruthenium (Ru), tungsten nitride, titanium nitride, tantalum nitride, tungsten carbide, titanium carbide, tungsten silicide, titanium silicide, tantalum silicide, ruthenium oxide, or a combination of two or more thereof, by way of non-limiting examples.

In an embodiment, the ferroelectric memory device described above is capable of forming polarization having different polarities in a ferroelectric superlattice structure 10. The formed polarization may be stored in a non-volatile manner in ferroelectric superlattice structure 10. The stored polarization with different polarities may change the density of a carrier in a channel region formed in substrate 101 under interfacial insulation layer 115 when a reading voltage is applied to gate electrode layer 155. According to the density of the carrier, working current conducting through the channel region is differentiated, so that electrical information stored in the ferroelectric memory device can be identified.

In some embodiments, superlattice structure 10 may include combinations of dielectric layers comprising different material structures. A dielectric layer may be selected from materials having a crystal structure in which atoms in a unit lattice can move to an asymmetric position with respect to each other in response to an externally applied stress. For example, the material of a dielectric layer may have a crystal structure consistent with a tetragonal crystal system, a monoclinic crystal system, or a cubic crystal system, each of which is easily converted into an orthorhombic crystal system exhibiting ferroelectricity. At this time, dielectric layers in a unit-stack may comprise metal oxides having similar atomic sizes.

As described above, in an embodiment, a superlattice structure in which different dielectric layers such as a hafnium oxide layer and a zirconium oxide layer are alternately stacked on a substrate is disclosed. In such an embodiment, lattice strain in the interface region between dielectric layers of different compositions in the superlattice structure can be effectively increased as the thickness of dielectric layers is reduced, including for example reduction of a thickness to a monolayer. Accordingly, ferroelectric properties of the superlattice structure can be controlled by anisotropic stress generated in the interface regions having the lattice strain of the dielectric layers constituting the superlattice structure.

Figure 2:
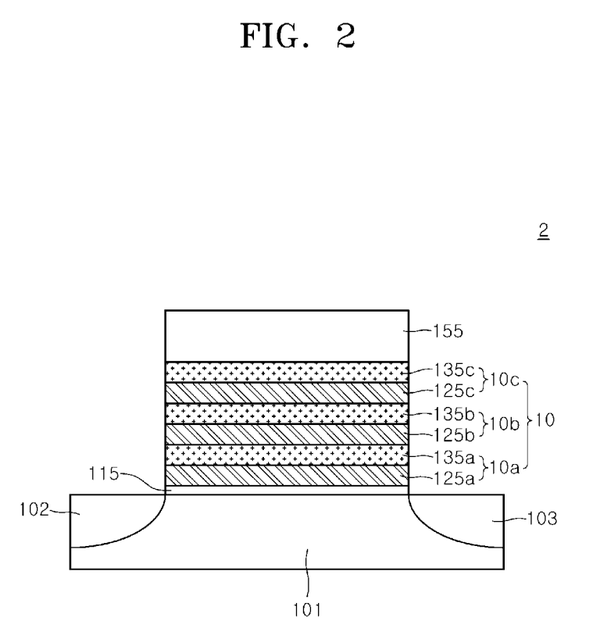
FIG. 2 is a schematic view illustrating a ferroelectric memory device according to an embodiment of the present disclosure.

FIG. 2 is a schematic view illustrating a ferroelectric memory device according to an embodiment of the present disclosure. Referring to FIG. 2, ferroelectric memory device 2 has substantially the same configuration as ferroelectric memory device 1 described above and with reference to FIG. 1, except that depolarization suppressing layer 145 (illustrated in FIG. 1) is omitted between superlattice structure 10 and gate electrode layer 155 in ferroelectric memory device 2.

Referring to FIG. 2 and ferroelectric memory device 2, in an embodiment, layer 135c is a zirconium oxide layer that may be disposed as the uppermost layer of superlattice structure 10 and unit-stack 10c. Zirconium oxide layer 135c may directly contact gate electrode layer 155 and may function as a depolarization suppressing layer for superlattice structure 10.

In other embodiments, the number of unit-stacks may not be fixed at three. In such embodiments, one or more unit-stacks may be included in the superlattice structure. Additional unit-stacks may be oriented such that, within the superlattice structure, dielectric layers with a first composition are disposed between dielectric layers with a second composition and dielectric layers with a second composition are disposed between dielectric layers with a first composition, or such that, within the superlattice structure, dielectric layers with a first composition are alternated with dielectric layers with a second composition, with the orientation of the unit-stacks resulting in the disposition of gate electrode layer 155 on a zirconium oxide layer.

Referring to FIG. 2 and ferroelectric memory device 2, in an embodiment, layers 135a, 135b and 135c are each comprised of zirconium oxide, however, the thickness of zirconium oxide layer 135c of unit-stack structure 10c may be greater than the thickness of each of zirconium oxide layers 135a and 135b of unit-stack structures 10a and 10b.

Referring to FIG. 2 and ferroelectric memory device 2, in this embodiment, the depolarization phenomenon occurring at an interface between gate electrode layer 155 and superlattice structure 10 can be effectively suppressed by disposing gate electrode layer 155 on zirconium oxide layer 135c, which has a high-k dielectric constant, without introducing an additional depolarization suppressing layer.

Figure 3:
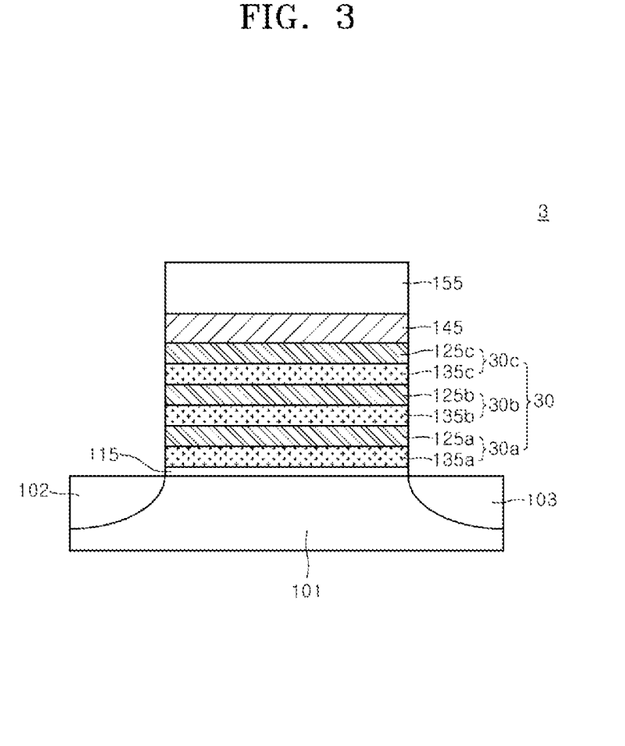
FIG. 3 is a schematic view illustrating a ferroelectric memory device according to an embodiment of the present disclosure

FIG. 3 is a schematic view illustrating a ferroelectric memory device according to an embodiment of the present disclosure. Referring to FIG. 3, ferroelectric memory device 3 has substantially the same configuration as ferroelectric memory device 1 of the embodiment described above and with reference to FIG. 1, except for the stacking order of the dielectric layers in superlattice structure 30.

Referring to FIG. 3 and ferroelectric memory device 3, in an embodiment, superlattice structure 30 may include three unit-stack structures 30a, 30b and 30c. Each of the unit-stack structures 30a, 30b and 30c may comprise zirconium oxide layers 135a, 135b and 135c respectively and hafnium oxide layers 125a, 125b and 125c respectively. In an embodiment, superlattice structure 30 may include three unit-stack structures 30a, 30b and 30c, with one unit-stack structure disposed on interfacial insulation layer 115 and the remaining unit-stack structures disposed such that zirconium oxide layers 135a, 135b and 135c alternate with hafnium oxide layers 125a, 125b and 125c. However, in some other embodiments, the number of unit-stacks may not be fixed at three. In such embodiments, one or more unit-stacks may be included in the superlattice structure. Additional unit-stacks may be oriented such that, within the superlattice structure, dielectric layers with a first composition are disposed between dielectric layers with a second composition and dielectric layers with a second composition are disposed between dielectric layers with a first composition, or such that, within the superlattice structure, dielectric layers with a first composition are alternated with dielectric layers with a second composition, with the orientation of the unit-stacks resulting in the disposition a zirconium oxide layer on the substrate or interfacial insulation layer.

Referring to FIG. 3, the uppermost layer of superlattice structure 30 may be hafnium oxide layer 125c, on which depolarization suppressing layer 145 is disposed. Also, the lowest layer of superlattice structure 30 disposed on substrate 101 and interfacial insulation layer 115 may be zirconium oxide layer 135a, which may interface with the interfacial insulation layer 115. Accordingly, zirconium oxide layer 135a may be the lowest layer of superlattice structure 30 to interface with interfacial insulation layer 115 and hafnium oxide layer 125c may be the top layer of superlattice structure 30.

In this embodiment, depolarization suppressing layer 145 may be disposed on hafnium oxide layer 125c to prevent formation of a direct interface with gate electrode layer 155. Depolarization suppressing layer 145 may include an electrical insulator having a high-k dielectric constant. As an example, depolarization suppressing layer 145 may comprise a zirconium oxide layer. As another example, depolarization suppressing layer 145 may comprise an aluminum oxide layer.

Figure 4:
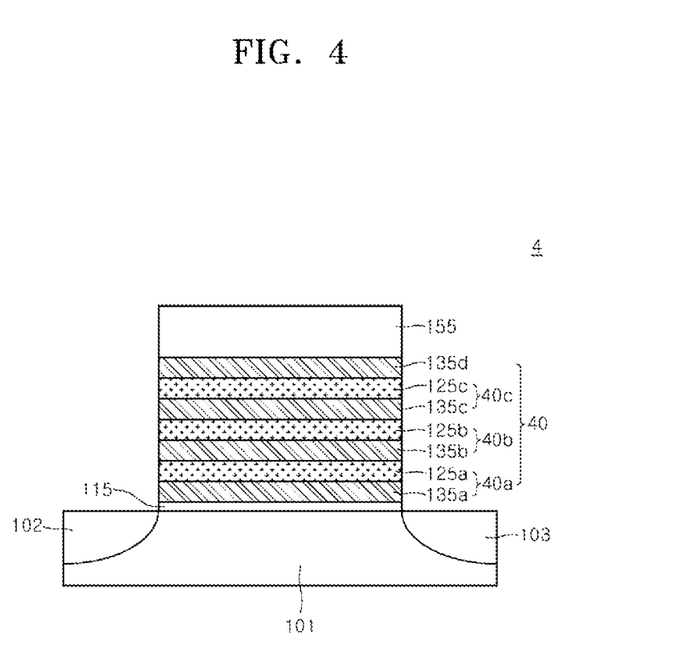
FIG. 4 is a schematic view illustrating a ferroelectric memory device according to an embodiment of the present disclosure.

FIG. 4 is a schematic view illustrating a ferroelectric memory device according to an embodiment of the present disclosure. Referring to FIG. 4B, ferroelectric memory device 4 has substantially the same configuration as ferroelectric memory device 2 of embodiments described above and with reference to FIG. 2, except for the order of dielectric layers in superlattice structure 40.

Referring to FIG. 4 and ferroelectric memory device 4, in an embodiment, superlattice structure 40 may include three unit-stack structures 40a, 40b and 40c and a dielectric layer 135d. Dielectric layer 135d may comprise zirconium oxide.

Each of the unit-stack structures 40a, 40b and 40c may comprise zirconium oxide layers 135a, 135b and 135c respectively and hafnium oxide layers 125a, 125b and 125c respectively. In an embodiment, superlattice structure 40 may include three unit-stack structures 40a, 40b and 40c, with one unit-stack structure disposed on interfacial insulation layer 115 and the remaining unit-stack structures disposed such that zirconium oxide layers 135a, 135b and 135c alternate with hafnium oxide layers 125a, 125b and 125c. However, in some other embodiments, the number of unit-stacks may not be fixed at three. In such embodiments, one or more unit-stacks may be included in the superlattice structure. Additional unit-stacks may be oriented such that, within the superlattice structure, dielectric layers with a first composition are disposed between dielectric layers with a second composition and dielectric layers with a second composition are disposed between dielectric layers with a first composition, or such that, within the superlattice structure, dielectric layers with a first composition are alternated with dielectric layers with a second composition, with the orientation of the unit-stacks resulting in the disposition a zirconium oxide layer on the substrate or interfacial insulation layer.

Referring to FIG. 4 again, the uppermost layer of superlattice structure 40 may be hafnium oxide layer 125c, on which zirconium oxide layer 135d is disposed. Also, the lowest layer of superlattice structure 40 disposed on substrate 101 and interfacial insulation layer 115 may be zirconium oxide layer 135a, which may interface with the interfacial insulation layer 115. Accordingly, zirconium oxide layer 135a may be the lowest layer of superlattice structure 40 to interface with interfacial insulation layer 115 and zirconium oxide layer 135d may be the top layer of superlattice structure 40.

In the event that superlattice structure 40 is comprised of three-unit stack structures 40a, 40b and 40c without zirconium oxide layer 135d, then hafnium oxide layer 125c may be the uppermost layer of superlattice structure 40. In the absence of zirconium oxide layer 135d, hafnium oxide layer 125c may directly interface with gate electrode layer 155, resulting in depolarization of hafnium oxide layer 125c.

To prevent such depolarization, in an embodiment, zirconium oxide layer 135d is additionally formed on unit-stack structure 40c as an uppermost layer of superlattice structure 40 so that zirconium oxide layer 135d can form an interface directly with gate electrode layer 155. As compared to hafnium oxide layer 125c, zirconium oxide layer 135d provides more electrical insulation and more interface stability with respect to gate electrode layer 155. In this manner, any depolarization phenomenon occurring at the interface between gate electrode layer 155 and superlattice structure 40 can be effectively suppressed without introducing an additional depolarization suppressing layer. In some embodiments, zirconium oxide layers 135a, 135b, 135c and 135d may each have substantially the same thickness.

Figure 5:
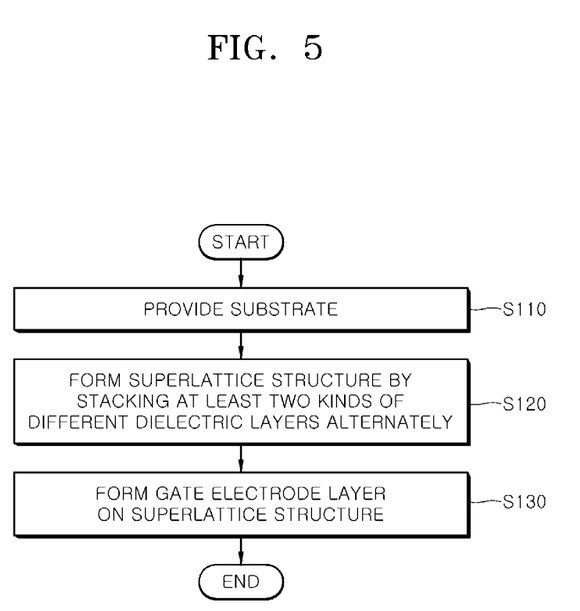
FIG. 5 is a flow chart schematically illustrating a method of manufacturing a ferroelectric memory device according to an embodiment of the present disclosure.

FIG. 5 is a flow chart schematically illustrating a method of manufacturing a ferroelectric memory device according to an embodiment of the present disclosure. FIGS. 6 to 10 are cross-sectional views schematically illustrating a method of manufacturing a ferroelectric memory device according to an embodiment of the present disclosure. Steps and processes disclosed herein and illustrated in FIGS. 5 to 10 may describe a manufacturing method of an embodiment of ferroelectric memory device 1 described above and with reference to FIG. 1.

Figure 6:
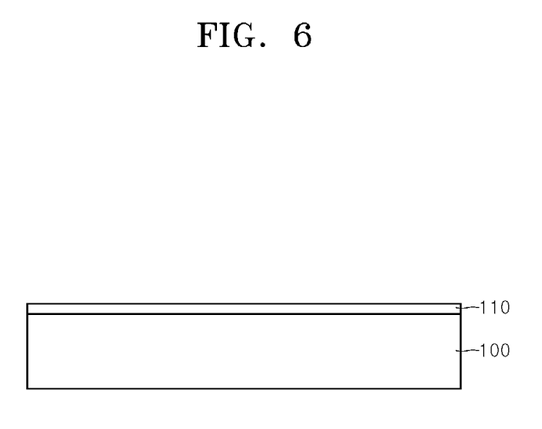
FIGS. 6 to 10 are schematic views illustrating a method of manufacturing a ferroelectric memory device according to an embodiment of the present disclosure.

Referring to operation S110 of FIG. 5 and FIG. 6, substrate 100 and interfacial insulation layer 110 are provided. Substrate 100 may comprise a silicon (Si) substrate, a gallium arsenide (GaAs) substrate, an indium phosphide (InP) substrate, a germanium (Ge) substrate, or a silicon germanium (SiGe) substrate by way of non-limiting examples. Substrate 100 may be doped with n-type or p-type dopants to have conductivity.

Although not illustrated in FIGS. 6 to 10, a source region and a drain region may be formed in substrate 100. The source region and the drain region may be doped with dopants of an opposite doping type to substrate 100. In an embodiment, when substrate 100 is n-type doped, the source region and the drain region may be p-type doped. In another embodiment, when substrate 100 is p-type doped, the source region and the drain region may be n-type doped. The source region and the drain region may be formed in an upper portion of substrate 100. The source region and the drain region may each be in the form of a well and created, for example, by ion implantation methods known in the art.

Referring to FIG. 6, interfacial insulation layer 110 is formed on an upper portion of substrate 100 and may compensate for the difference in lattice constant between a superlattice structure 50 that will be formed on interfacial insulation layer 110 and substrate 100 to eliminate, reduce or control interfacial stress. For example, interfacial insulation layer 110 may have a lattice constant that is between the lattice constant of substrate 100 and the lattice constant of superlattice structure 50. In addition, interfacial insulation layer 110 can serve as a barrier to material diffusion between substrate 100 and superlattice structure 50.

Interfacial insulation layer 110 may include, as non-limiting examples, a silicon oxide material, a silicon nitride material, or a silicon oxynitride material. Interfacial insulation layer 110 may be formed by, for example, applying a chemical vapor deposition method, an atomic layer deposition method, a coating method or other methods known in the art.

Figure 7:
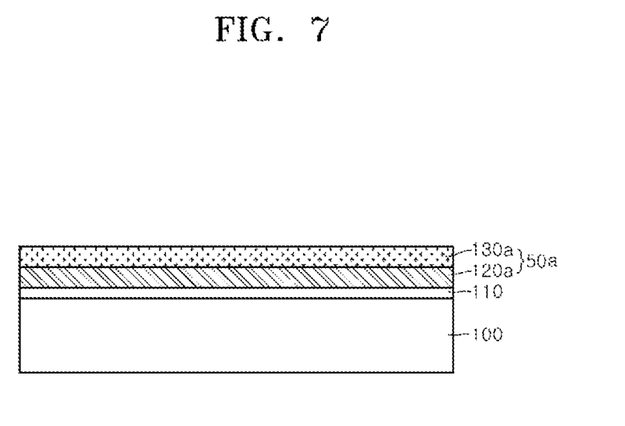
Figure 8:
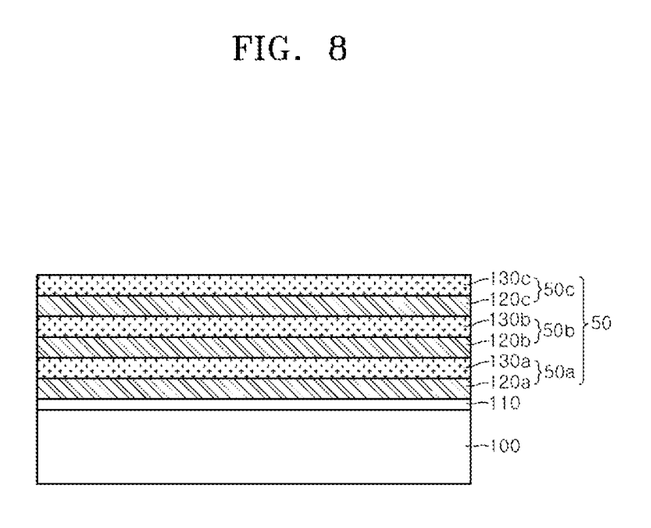

Referring to operation S120 of FIG. 5 and FIGS. 7 to 8, at least two kinds of different dielectric layers are alternately stacked or layered on interfacial insulation layer 110 to form a superlattice structure 50. In a non-limiting example, within the superlattice structure, a first dielectric layer having a first composition may be formed on a substrate, followed by a first dielectric layer having a second composition. A second dielectric layer having a first composition may be formed on the first dielectric layer having a second composition, followed by a second dielectric layer having a second composition. Additional dielectric layers may be sequentially formed on previously formed dielectric layers consistent with this alternating pattern to form a superlattice structure. In another non-limiting example, one or more unit-stacks may be used in a superlattice structure. A unit-stack may comprise a dielectric layer with a first composition, followed by a dielectric layer with a second, different composition formed on the dielectric layer with a first composition. Additional unit-stacks in a superlattice structure may be oriented such that, within the superlattice structure, dielectric layers with a first composition are formed between dielectric layers with a second composition and dielectric layers with a second composition are formed between dielectric layers with a first composition, or such that, within the superlattice structure, dielectric layers with a first composition are alternated with dielectric layers with a second composition.

More specifically, referring to FIG. 7, a first hafnium oxide layer 120a and a first zirconium oxide layer 130a are sequentially formed on interfacial insulation layer 110. First hafnium oxide layer 120a and first zirconium oxide layer 130a may form a first unit-stack structure 50a. First hafnium oxide layer 120a and first zirconium oxide layer 130a may be formed by utilizing, for example, an atomic layer deposition method, a chemical vapor deposition method, a molecular beam evaporation method, an evaporation method or other methods known in the art.

In an embodiment, using an atomic layer deposition method, first hafnium oxide layer 120a is formed as a monolayer of about 5 Å thick on interfacial insulation layer 110, and then first zirconium oxide layer 130a is formed on first hafnium oxide layer 120a as a monolayer of about 5 Å thick.

In another embodiment, using an atomic layer deposition method, first hafnium oxide layer 120a is formed by disposing a plurality of monolayers of hafnium oxide on interfacial insulation layer 110, and then first zirconium oxide layer 130a is formed by disposing a plurality of monolayers of zirconium oxide on first hafnium oxide layer 120a. In an embodiment, the thickness of first hafnium oxide layer 120a and the thickness of first zirconium oxide layer 130a may be substantially the same.

In an embodiment, first hafnium oxide layer 120a and first zirconium oxide layer 130a may be formed, for example, at a substrate temperature of about 150 degrees Celcius (° C.) to 350 degrees Celcius (° C.). First hafnium oxide layer 120a and first zirconium oxide layer 130a may be formed in an amorphous state, a partially crystalline state, or a fully crystalline state.

Referring to FIG. 8, a second unit-stack 50b and a third unit-stack 50c are sequentially formed on first unit-stack 50a. Unit-stack 50b includes a second hafnium oxide layer 120b and a second zirconium oxide layer 130b, and the third unit-stack structure 50c includes a third hafnium oxide layer 120c and a third zirconium oxide layer 130c.

The second and third unit-stack structures 50b and 50c may be formed using methods that are substantially the same as methods for forming first unit-stack structure 50a. As a result, superlattice structure 50 may be formed with three unit-stack structures 50a, 50b and 50c. In an embodiment, superlattice structure 50 may be formed, for example, with a total thickness of about 5 to 20 nm.

Figure 9:
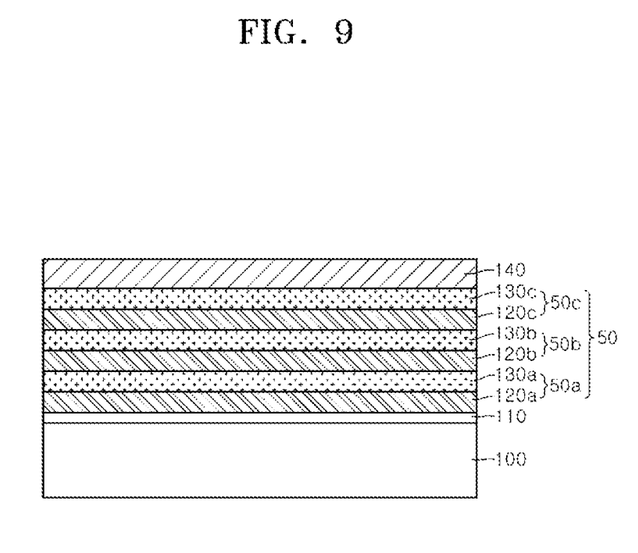
Figure 10:
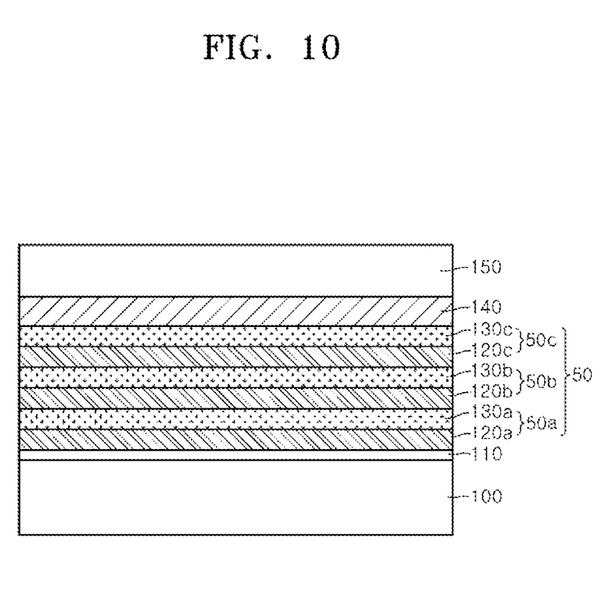

Referring to FIGS. 9 and 10, in an embodiment a depolarization suppressing layer 140 may be additionally formed on superlattice structure 50. Depolarization suppressing layer 140 may, for example, include a zirconium oxide layer or an aluminum oxide layer. Depolarization suppressing layer 140 may, for example, be formed using a chemical vapor deposition method, an atomic layer deposition method, a coating method or similar methods known in the art. In an embodiment, when a zirconium oxide layer is formed as depolarization suppressing layer 140, the process for forming the zirconium oxide layer may be performed in-situ during formation of superlattice structure 50. In another embodiment, the process for forming depolarization suppressing layer 140 may be performed ex-situ after forming the superlattice structure 50.

Referring to FIG. 10, a gate electrode layer 150 is formed on depolarization suppressing layer 140. Gate electrode layer 150 may include tungsten (W), titanium (Ti), copper (Cu), aluminum (Al), tungsten nitride, titanium nitride, tantalum nitride, tungsten carbide, titanium carbide, tungsten silicide, titanium silicide, tantalum silicide, ruthenium oxide or a combination of two or more thereof, as non-limiting examples. Gate electrode layer 150 may, for example, be formed using a sputtering method, a chemical vapor deposition method, an evaporation method or an atomic layer deposition method.

Although not illustrated, when at least one of hafnium oxide layers 120a, 120b and 120c and zirconium oxide layers 130a, 130b and 130c is formed in an amorphous state, a crystallization heat treatment for hafnium oxide layers 120a, 120b and 120c and zirconium oxide layers 130a, 130b and 130c may be additionally performed. The crystallization heat treatment may be performed at a process temperature of about 400° C. to 600° C.

In an embodiment, the crystallization heat treatment may be performed after forming gate electrode layer 150. In another embodiment, the crystallization heat treatment may be performed before forming gate electrode layer 150. In yet another embodiment, the crystallization heat treatment may be performed during formation of gate electrode layer 150. When the formation of gate electrode layer 150 is performed at a process temperature of about 400° C. to 600° C., hafnium oxide layers 120a, 120b and 120c and zirconium oxide layers 130a, 130b and 130c may crystallize during formation of gate electrode layer 150, in which case the additional crystallization heat treatment may be omitted.

Although not illustrated, gate electrode layer 150 and superlattice structure 50 may be patterned over substrate 100 to form a gate structure. As a result, a ferroelectric memory device including the gate structure, a channel region formed in substrate 100 under the gate structure, and a source region and a drain region disposed in the substrate of both sides of the gate structure can be fabricated. Although it is not illustrated, in some embodiments, the source region and the drain region may be formed after forming the gate structure. The source region and the drain region may be formed by selectively doping substrate 100 using known ion implantation methods.

In some other embodiments, the process of forming depolarization suppressing layer 140 described above with reference to FIGS. 5, 9 and 10 may be omitted. Accordingly, zirconium oxide layer 130c, which is the uppermost layer of superlattice structure 50, can perform the function of depolarization suppressing layer 140. Here, the thickness of zirconium oxide layer 130c of the third unit-stack structure 50c may be greater than the thickness of zirconium oxide layers 130a and 130b of the first and second unit-stack structures 50a and 50b respectively. Such an embodiment is consistent with the fabrication of ferroelectric memory device 2 of an embodiment described above and with reference to FIG. 2.

In some other embodiments, in forming unit-stacks 50a, 50b and 50c in S120 of FIG. 5, the order of hafnium oxide layers 120a, 120b and 120c and zirconium oxide layers 130a, 130b and 130c may be reversed within each unit-stack illustrated in FIGS. 7 to 10. More specifically, in unit-stack structures 50a, 50b and 50c, zirconium oxide layers 130a, 130b and 130c may be formed in the lower portion of the respective unit-stack structures and hafnium oxide layers 120a, 120b and 120c may be formed at the upper portions of each respective unit-stack. In other words, within each unit-stack, the zirconium oxide layer may be formed closer to substrate 100 relative to the hafnium oxide layer, which is in turn formed closer to gate electrode 150 relative to the zirconium oxide layer. Such an embodiment is consistent with the fabrication of ferroelectric memory device 3 of an embodiment described above and with reference to FIG. 3.

Furthermore, instead of forming depolarization suppressing layer 140 on hafnium oxide layer 120c of unit-stack structure 50c, an additional zirconium oxide layer may be formed on hafnium oxide layer 120c in the process of forming superlattice structure 50. Such an embodiment is consistent with the fabrication of ferroelectric memory device 4 in an embodiment described above and with reference to FIG. 4.

As described above, according to embodiments of the present disclosure, a superlattice structure including at least two kinds of different dielectric layers alternately stacked or layered is formed on a substrate. The stress generated at an interface between the different dielectric layers in the formation of the superlattice structure can convert the superlattice structure into a ferroelectric structure. According to embodiments of the present disclosure, a structurally stable ferroelectric material layer can be provided by effectively increasing lattice strain in the interfacial region and controlling anisotropic stress in the interfacial region having the increased lattice strain.

Embodiments of the inventive concepts have been disclosed herein above for illustrative purposes. Those of ordinary skill in the art will appreciate that various modifications, additions and substitutions are possible, without departing from the scope and spirit of the inventive concepts as disclosed in the accompanying claims.

What is claimed is:

1. A ferroelectric memory device comprising:
a substrate having a source region and a drain region;
a ferroelectric superlattice structure disposed on the substrate and having at least two kinds of different dielectric layers alternately stacked;
a depolarization suppressing layer disposed on the ferroelectric superlattice;
a gate electrode layer disposed on the depolarization suppressing layer,
wherein each of the at least two kinds of different dielectric layers is a monolayer,
wherein the depolarization suppressing layer has a non-ferroelectric property and includes a layer with substantially the same composition as one of at least two kinds of different dielectric layers,
wherein the depolarization suppressing layer disposed between the superlattice structure and the gate electrode layer comprises a zirconium oxide layer or an aluminum oxide layer.

2. The ferroelectric memory device of claim 1, wherein the superlattice structure comprises a hafnium oxide layer and a zirconium oxide layer.

3. The ferroelectric memory device of claim 2, wherein the hafnium oxide layer and the zirconium oxide layer have substantially the same thickness.

4. The ferroelectric memory device of claim 1, wherein the superlattice structure comprises a plurality of unit-stack structures, and
each unit-stack in the plurality of unit-stack structures comprises one hafnium oxide layer and one zirconium oxide layer.

5. The ferroelectric memory device of claim 4, wherein an uppermost layer of the superlattice structure comprises a hafnium oxide layer.

6. The ferroelectric memory device of claim 4, wherein the superlattice structure has a total thickness of about 5 nm to 20 nm.

7. The ferroelectric memory device of claim 1, wherein the gate electrode layer comprises at least one selected from tungsten (W), titanium (Ti), copper (Cu), aluminum (Al), ruthenium (Ru), tungsten nitride, titanium nitride, tantalum nitride, tungsten carbide, titanium carbide, tungsten silicide, titanium silicide, tantalum silicide and ruthenium oxide.

8. The ferroelectric memory device of claim 1,
further comprising an interfacial insulation layer disposed between the substrate and the superlattice structure,
wherein the interfacial insulation layer comprises one selected from silicon oxide, silicon nitride and silicon oxynitride.

9. A method of manufacturing a ferroelectric memory device comprising:
providing a substrate;
forming a ferroelectric superlattice structure by alternately stacking at least two kinds of different dielectric layers on the substrate;
forming a depolarization suppressing layer with a non-ferroelectric property on the ferroelectric superlattice structure;
forming a gate electrode layer on the depolarization suppressing layer, wherein each of the at least two kinds of different dielectric layers is a monolayer,
wherein the depolarization suppressing layer includes a layer with substantially the same composition as one of at least two kinds of different dielectric layers,
wherein the depolarization suppressing layer between the superlattice structure and the gate electrode layer-comprises an aluminum oxide layer.

10. The method of claim 9,
wherein forming the superlattice structure is performed using one of an atomic layer deposition method, a chemical vapor deposition method, a molecular beam deposition method and an evaporation method.

11. The method of claim 9,
wherein forming the superlattice structure is performed at a substrate temperature of 150° C. to 350° C.

12. The method of claim 9,
wherein forming the superlattice structure comprises:
forming at least one hafnium oxide layer as a monolayer; and
forming at least one zirconium oxide layer as a monolayer in contact with the at least one hafnium oxide layer,
wherein the thickness of each hafnium oxide layer and the thickness of each zirconium oxide layer are substantially the same.

13. The method of claim 12, wherein in forming the superlattice structure, a total thickness of the superlattice structure is about to 5 nm to 20 nm.

14. The method of claim 12, wherein in forming the superlattice structure, the hafnium oxide layer is formed as the uppermost layer of the superlattice structure.

15. The method of claim 9, wherein the gate electrode layer comprises at least one selected from tungsten (W), titanium (Ti), copper (Cu), aluminum (Al), ruthenium (Ru), tungsten nitride, titanium nitride, tantalum nitride, tungsten carbide, titanium carbide, tungsten silicide, titanium silicide, tantalum silicide and ruthenium oxide.

16. The method of claim 9,
further comprising performing a crystallization heat treatment on the superlattice structure,
wherein the crystallization heat treatment is performed at a process temperature of 400° C. to 600° C.

17. The method of claim 16,
wherein the crystallization heat treatment is performed during formation of the gate electrode layer.

* * * * *